United States Patent
Kandel et al.

(10) Patent No.: US 7,616,313 B2
(45) Date of Patent: Nov. 10, 2009

(54) APPARATUS AND METHODS FOR DETECTING OVERLAY ERRORS USING SCATTEROMETRY

(75) Inventors: Daniel Kandel, Aseret (IL); Walter D. Mieher, Los Gatos, CA (US); Boris Golovanevsky, Haifa (IL)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/525,320

(22) Filed: Sep. 21, 2006

(65) Prior Publication Data

US 2007/0229829 A1    Oct. 4, 2007

Related U.S. Application Data

(60) Provisional application No. 60/788,005, filed on Mar. 31, 2006.

(51) Int. Cl.
    *G01B 11/00* (2006.01)
(52) U.S. Cl. ....................................................... 356/401
(58) Field of Classification Search .......... 356/399–401
    See application file for complete search history.

(56) References Cited

U.S. PATENT DOCUMENTS

| | | | | |
|---|---|---|---|---|
| 5,923,041 | A * | 7/1999 | Cresswell et al. | 250/491.1 |
| 6,689,519 | B2 | 2/2004 | Brown et al. | |
| 6,982,793 | B1 * | 1/2006 | Yang et al. | 356/401 |
| 7,042,569 | B2 * | 5/2006 | Sezginer et al. | 356/401 |
| 7,170,604 | B2 * | 1/2007 | Sezginer et al. | 356/400 |
| 7,230,704 | B2 * | 6/2007 | Sezginer et al. | 356/401 |
| 7,379,184 | B2 * | 5/2008 | Smith et al. | 356/401 |
| 2003/0002043 | A1 | 1/2003 | Abdulhalim et al. | |
| 2003/0043372 | A1 * | 3/2003 | Schulz | 356/327 |
| 2004/0169861 | A1 * | 9/2004 | Mieher et al. | 356/400 |
| 2004/0233439 | A1 * | 11/2004 | Mieher et al. | 356/401 |
| 2004/0233441 | A1 | 11/2004 | Mieher et al. | |
| 2005/0012928 | A1 * | 1/2005 | Sezginer et al. | 356/401 |
| 2005/0195398 | A1 * | 9/2005 | Adel et al. | 356/401 |

OTHER PUBLICATIONS

International Search Report Dated Oct. 23, 2007.
Written Opinion of PCT/US07/06031 Dated Oct. 23, 2007.

* cited by examiner

*Primary Examiner*—Tarifur R. Chowdhury
*Assistant Examiner*—Isiaka O Akanbi
(74) *Attorney, Agent, or Firm*—Suiter Swantz pc llo

(57) ABSTRACT

Embodiments of the invention include a scatterometry target for use in determining the alignment between substrate layers. A target arrangement is formed on a substrate and comprises a plurality of target cells. Each cell has two layers of periodic features constructed such that an upper layer is arranged above a lower layer and configured so that the periodic features of the upper layer have an offset and/or different pitch than periodic features of the lower layer. The pitches are arranged to generate a periodic signal when the target is exposed to an illumination source. The target also includes disambiguation features arranged between the cells and configured to resolve ambiguities caused by the periodic signals generated by the cells when exposed to the illumination source.

36 Claims, 9 Drawing Sheets

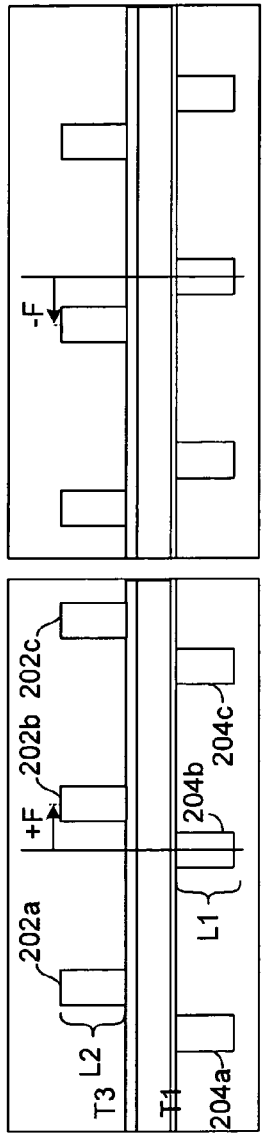
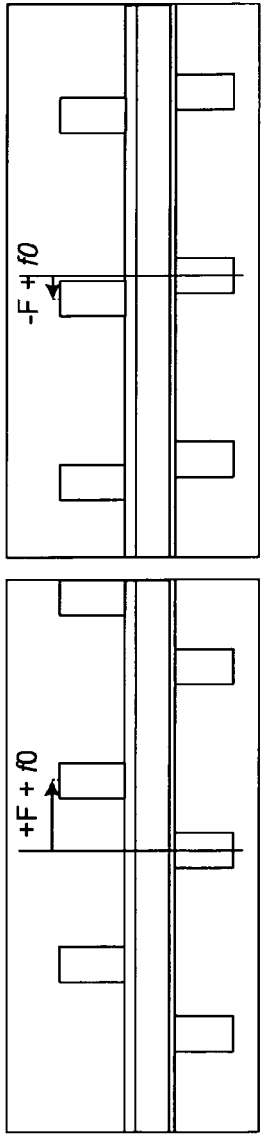
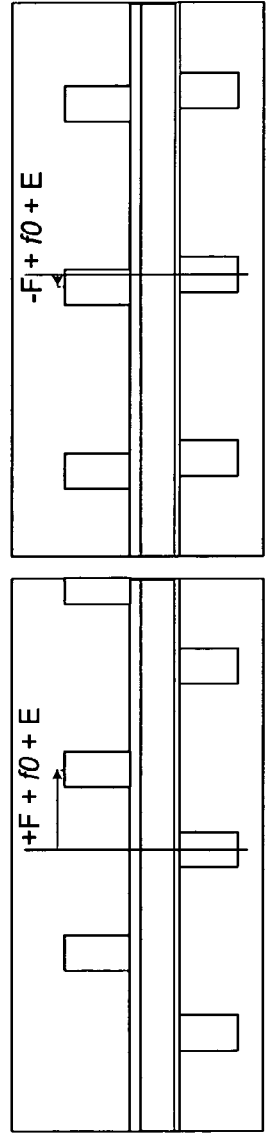
FIG. 2(a) FIG. 2(b) FIG. 2(c) FIG. 2(d) FIG. 2(e) FIG. 2(f)

APPARATUS AND METHODS FOR DETECTING OVERLAY ERRORS USING SCATTEROMETRY

CROSS REFERENCE TO RELATED PATENT APPLICATIONS

This application is related to and claims priority to Application No. 60/788,005, filed Mar. 31, 2006, entitled "APPARATUS AND METHODS FOR DETECTING OVERLAY ERRORS USING SCATTEROMETRY", by Daniel Kandel, et al. The above application being incorporated by reference in its entirety for all purposes.

Also, this application is related to the following U.S. Provisional Patent Applications:
(1) Application No. 60/431,314, entitled METHOD FOR DETERMINING OVERLAY ERROR BY COMPARISON BETWEEN SCATTEROMETRY SIGNALS FROM MULTIPLE OVERLAY MEASUREMENT TARGETS, by Walter D. Mieher et al., filed 5 Dec. 2002,
(2) Application No. 60/440,970, entitled METHOD FOR DETERMINING OVERLAY ERROR BY COMPARISON BETWEEN SCATTEROMETRY SIGNALS FROM MULTIPLE OVERLAY MEASUREMENT TARGETS WITH SPECTROSCOPIC IMAGING OR SPECTROSCOPIC SCANNING, by Walter D. Mieher, filed 17 Jan. 2003,
(3) Application No. 60/504,093, entitled APPARATUS AND METHODS FOR DETECTING OVERLAY ERRORS USING SCATTEROMETRY, by Walter D. Mieher, filed 19 Sep. 2003,
(4) Application No. 60/449,496, entitled METHOD AND SYSTEM FOR DETERMINING OVERLAY ERRORS BASED ON SCATTEROMETRY SIGNALS ACQUIRED FROM MULTIPLE OVERLAY MEASUREMENT PATTERNS, by Walter D. Mieher, filed 22 Feb. 2003,
(5) Application No. 60/498,524, filed 27 Aug. 2003, entitled "METHOD AND APPARATUS COMBINING IMAGING AND SCATTEROMETRY FOR OVERLAY METROLOGY", by Mike Adel, and
(6) Application No. 60/785,430, filed 23 Feb. 2004, entitled "APPARATUS AND METHOD FOR DETECTING OVERLAY ERRORS USING SCATTEROMETRY", and published as Application No. 20040233441 on 25 Nov. 2004, by Walter D. Mieher, et al. These applications are herein incorporated by reference in their entirety.

TECHNICAL FIELD

The invention described herein relates generally to methods and apparatus for determining the alignment of overlay structures formed in single or multiple layers. More particularly, it relates to using improved targets and methods for determining overlay based on diffraction of radiation interacting with such structures.

BACKGROUND

In various manufacturing and production environments, there is a need to control alignment between various layers of samples, or within particular layers of such samples. For example, in the semiconductor manufacturing industry, electronic devices may be produced by fabricating a series of layers on a substrate, some or all of the layers including various structures. The relative position of such structures both within particular layers and with respect to structures in other layers is relevant or even critical to the performance of completed electronic devices.

The relative position of structures within such a sample is sometimes called overlay. Various technology and processes for measuring overlay have been developed and employed with varying degrees of success. More recently, various efforts have been focused on utilizing radiation scatterometry as a basis for overlay metrology.

Certain existing approaches to determining overlay from scatterometry measurements concentrate on comparison of the measured spectra to calculated theoretical spectra based on model shape profiles, overlay, and film stack, and material optical properties (n, k dispersion curves), or comparison to a reference signal from a calibration wafer. In alternative approaches, various implementations of sub-optimal multi-cell targets have been employed. However, these approaches have numerous shortcomings, which the present invention seeks to overcome. The present invention discloses improved scatterometry overlay (SCOL) target structures and methods.

SUMMARY OF THE INVENTION

In accordance with the principles of the present invention, an improved overlay target arrangement and methods for its fabrication and use are disclosed.

In general, the present invention is directed toward target arrangements that include target cells having overlaid tiers of periodic features set with possibly different pitches. Further embodiments enhance the target arrangements through the addition of disambiguation features that enable resolution of ambiguities in the periodic signals generated by the target cells. Method of using these target arrangements are also disclosed.

One embodiment of the invention comprises a target arrangement for determining overlay alignment. The target arrangement is formed on a substrate to be inspected such that the arrangement includes at least two layers that are capable of being illuminated by an illumination source to produce a resulting spectrum (signal). The target arrangement comprises a plurality of periodic target cells configured such that each cell has a top layer arranged above a bottom layer. The layers are configured such that the top layer has periodic features and the bottom layer has periodic features and such that there is an offset between the top layer and the bottom layer of the cell. Additionally, the target cells can be configured so that the periodic features of the top layer have a different pitch than the periodic features of the bottom layer. The ratio of the periodic features of the top layer to the periodic features of the bottom layer defines a pitch ratio selected so that the two layer cell, as a whole, is periodic.

Also, an inventive target arrangement can include embodiments that include disambiguation features, which upon illumination and analysis, enable the resolution of ambiguities in the spectra generated by the periodic target cells.

In another embodiment, a target arrangement configured similar to the above embodiments is arranged so that the values of offsets provide improved accuracy and repeatability of overlay measurements.

In an additional embodiment, the target cells are configured so that the periodic features of the top layer have the same pitch as the periodic features of the bottom layer. In yet another alternative embodiment, the periodic features of the top layer of a target cell can be arranged to have a different pitch than the periodic features of the bottom layer of the cell. In such case, the pitch ratio for the cell can be chosen such that each target cell (comprising the two layers) is periodic.

In another embodiment, the target arrangement comprises a plurality of periodic target cells formed on a substrate such that the cells each include at least two layers that are capable of being illuminated by an illumination source to produce a resulting spectrum (signal). The target arrangement comprises a plurality of periodic target cells configured such that each cell has a top layer arranged above a bottom layer. The layers are configured such that the top layer has periodic features and the bottom layer has periodic features and such that there is an offset between the top layer and the bottom layer of the cell. The values of offsets are chosen for optimized accuracy and repeatability of the overlay measurement. Additionally, the target cells are configured so that the periodic features of the top layer have a different pitch than the periodic features of the bottom layer. The pitch ratio being chosen so that the complete structure of the two layers is periodic.

In another embodiment the invention includes a method of determining overlay error using the aforementioned target arrangements. A substrate is provided having a target arrangement formed thereon. The target arrangement includes a plurality of target cells each having first and second layers with a set of periodic features configured such that the periodic features of the first layer have a different pitch than the periodic features of the second layer. The target arrangement is also provided having disambiguation features arranged between the target cells, the disambiguation features being configured to enable resolution of signal ambiguities caused by the generation of the spectra during illumination of the cells. The target cells are illuminated to obtain spectra associated with each of the target cells. Also, the disambiguation features are illuminated to obtain a signal associated with the disambiguation features. The spectra information is used to determine the overlay error between the first and second layers. Any ambiguity in this determination is resolved by using information obtained from the signal associated with the disambiguation features.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which:

FIG. 2(a) is a side view illustration of a patterned top layer L2 being offset by an amount +F from a patterned bottom layer L1 in accordance with one embodiment of the present invention.

FIG. 2(b) is a side view illustration of a patterned top layer L2 being offset by an amount −F from a patterned bottom layer L1 in accordance with one embodiment of the present invention.

FIG. 2(c) is a side view illustration of a patterned top layer L2 being offset by an amount $+F+f_0$ from a patterned bottom layer L1 in accordance with one embodiment of the present invention.

FIG. 2(d) is a side view illustration of a patterned top layer L2 being offset by an amount $-F+f_0$ from a patterned bottom layer L1 in accordance with one embodiment of the present invention.

FIG. 2(e) is a side view illustration of a patterned top layer L2 being offset by an amount $+F+f_0+E$ from a patterned bottom layer L1 in accordance with one embodiment of the present invention.

FIG. 2(f) is a side view illustration of a patterned top layer L2 being offset by an amount $-F+f_0+E$ from a patterned bottom layer L1 in accordance with one embodiment of the present invention.

It is to be understood that in the drawings like reference numerals designate like structural elements. Also, it is understood that the depictions in the Figures are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In general, the present invention encompasses scatterometry targets and methods for their use in determining overlay alignment errors.

Aspects of the invention enable optimal scatterometry overlay (SCOL) target design. A SCOL target commonly consists of two sets of four (4) cells (one set for each direction). Each cell includes two overlapping gratings generally set in two overlapping layers. The design (e.g., the pitch and grating configuration) of each set includes four (4) cells that are identical except for an intentional offset between the top and bottom gratings of each cell.

A basic discussion of the principles of SCOL using uniform pitch targets is explained briefly as follows. A set of four or more scatterometry overlay targets are formed on a sample, such as a semiconductor device. In a particular implementation, the targets are used to provide a measure of the placement accuracy of various structures comprised in the device.

In general, placement accuracy is characterized by measurement of an overlay error between two different layers of the semiconductor device.

In one brief example illustration, a set of four targets is provided with each target having two sets of structures on two different layers which are offset from each other. The structures define gratings that can be used to determine overlay alignment. In a specific implementation, an offset may be defined as the sum or the difference of two separate distances: a first distance F and a second distance $f_0$, with F being greater than $f_0$. Denoting the four targets as "target A", "target B", "target C" and "target D", predetermined offsets for each of these targets may be defined as follows for an example of one target design:

$X_a = +F+f_0$ (for target A), $X_b = -F+f_0$ (for target B), $X_c = +F-f_0$ (for target C), and $X_d = -F-f_0$ (for target D).

Figure 1:
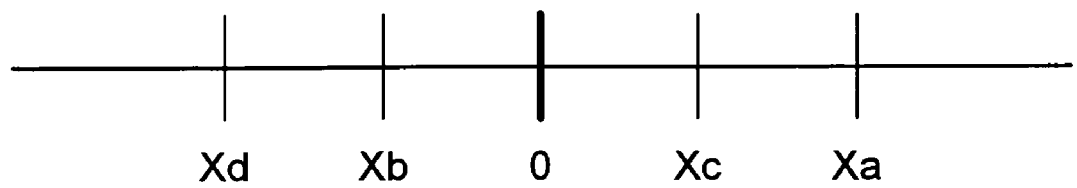
FIG. 1 illustrates the relative distribution of designed overlay offsets $X_a$, $X_b$, $X_c$, and $X_d$ for corresponding interlayer patterns (overlay targets) A, B, C, and D according to an embodiment of the present invention.

The offsets for $X_a$ through $X_d$ may be any suitable value for practicing the techniques of the present invention so as to determine overlay. In one example, FIG. 1 illustrates the distribution of offsets $X_a$, $X_b$, $X_c$ and $X_d$ along the x-axis. As shown, the offsets $X_a$ and $X_c$ are both positive with $X_a$ being larger than Xc. Offsets $X_b$ and $X_d$ are both negative with $X_d$ being more negative than $X_b$.

The number of targets and the magnitude and sense of their corresponding offsets may be chosen in any suitable manner so that the techniques of the present invention may be practiced to determine overlay error. An illustrative example set of targets and their corresponding offsets are described below in relation to FIGS. 2(a) through 2(f).

FIG. 2(a) is a side cross-section view illustrating an example patterned grating in a top layer L2 having an offset F from a patterned grating of a bottom layer L1. Each layer L1 and L2 is patterned into a set of structures. The structures may include any suitable feature, such as a line, trench or a contact. The structures may be designed to be similar to a semiconductor device feature. The structures may also be formed from a combination of different features. In general these structures are configured as diffraction gratings. Further, the structures may be located on any layer of the sample, e.g., either above the top layer of the sample, within any layer of the sample, or partially or completely within a layer of the sample. In the illustrated embodiment of FIG. 2(a), layer L1 includes the complete structures 204a-c, while layer L2 includes the complete structures 202a-c. Construction of scatterometry overlay targets structures and methods for producing them are described in U.S. patent application, having application Ser. No. 09/833,084, filed 10 Apr. 2001, entitled "PERIODIC PATTERNS AND TECHNIQUE TO CONTROL MISALIGNMENT", by Abdulhalim, et al., which application is herein incorporated by reference in its entirety.

As shown, the structures of the top layer L2 are offset by an amount F from the structures of the bottom layer L1. The structures of the two offset layers may be located within adjacent layers or have any suitable number and types of layers disposed in between the two offset layers. FIG. 2(a) also shows three films T1, T2, and T3 between patterned layers L1 and L2 and their corresponding structures. To the extent that any other layers exist between the two layers having the structures, these other layers exhibit at least a minimum degree of transmission for electromagnetic radiation to permit propagation of the radiation between the layers having the structures.

FIG. 2(b) is a side view illustration of a patterned top layer L2 being offset by an amount −F from a patterned bottom layer L1 in accordance with one embodiment of the present invention. FIG. 2(c) is a side view illustration of a patterned top layer L2 being offset by an amount +F+$f_0$ from a patterned bottom layer L1 in accordance with one embodiment of the present invention. FIG. 2(d) is a side view illustration of a patterned top layer L2 being offset by an amount +F+$f_0$ from a patterned bottom layer L1 in accordance with one embodiment of the present invention. FIG. 2(e) is a side view illustration of a patterned top layer L2 being offset by an amount +F+$f_0$+E from a patterned bottom layer L1 in accordance with one embodiment of the present invention. FIG. 2(f) is a side view illustration of a patterned top layer L2 being offset by an amount −F+$f_0$+E from a patterned bottom layer L1 in accordance with one embodiment of the present invention.

In general, an error offset E may be determined by analyzing at least the measured spectra from four or more targets A, B, C, and D each having offsets between two patterned layers, such as offsets $X_a$ through $X_d$. This analysis can be performed without comparing any of the spectra to a known or reference spectra i.e., in the absence of calibration.

In one approach, the four targets A, B, C, and D are designed to have offsets $X_a$ through $X_d$ as described above. That is, target A is designed with offset +F+$f_0$; target B with offset −F+$f_0$; target C with offset +F−$f_0$; and target D with offset −F−$f_0$.

A incident radiation beam is directed towards each of the four targets A, B, C, and D to generate four spectra $S_A$, $S_B$, $S_C$, and $S_D$ from the four targets. Examples of optical systems and methods for measuring scatterometry signals to determine overlay may be found in (1) U.S. patent application, having patent Ser. No. 09/849,622, filed 4 May 2001, entitled "METHOD AND SYSTEMS FOR LITHOGRAPHY PROCESS CONTROL", by Lakkapragada, Suresh, et al. and (2) U.S. patent application, having application Ser. No. 09/833,084, filed 10 Apr. 2001, entitled "PERIODIC PATTERNS AND TECHNIQUE TO CONTROL MISALIGNMENT", by Abdulhalim, et al. These applications are herein incorporated by reference in their entirety. This cell configuration is illustrated in FIG. 1. The spectra can be captured, measured, processed, and compared to measure overlay error. Many approaches can be employed, with one particular approach being described in detail in U.S. Patent Publication No. US 2004/0233441, filed 23 Feb. 2004, entitled "APPARATUS AND METHOD FOR DETECTING OVERLAY ERRORS USING SCATTEROMETRY", by Walter D. Mieher, et al., which application is incorporated by reference in its entirety for all purposes.

Aspects of the invention can be used to improve the design of the foregoing SCOL targets. Embodiments of the invention can be used to optimize the number of cells in a target and their respective offsets. Other embodiments of the invention can be used to define a range of pitch relationships that characterize the relationship between the pitch of the top and bottom gratings where the pitches of the two layers are not the same. Additionally, values for the intentional offsets (F, $f_0$) between the gratings for given pair of layers having differing pitches can be determined. Also, target structures can be enhanced using added elements to reduce the inherent ambiguity in overlay measurements obtained using SCOL.

Heretofore, typical SCOL targets used the same pitch for both the top and bottom gratings, i.e., the pitch of the top and bottom gratings are identical. The following disclosure specifically identifies some implementation parameters that are highly suitable for use in accordance with the principles of the invention.

Enhanced Targeting Arrangements

The inventors contemplate an improved approach for obtaining SCOL overlay measurements.

Many extraneous concerns can affect the design of SCOL targets. For example, the constraints posed by lithography and other semiconductor processes and architectures may not always permit the pitch of the top and bottom gratings to be the same. One example of a common situation where this problem occurs involves the situation where a substrate includes a device pitch that is positioned near the target and has a pitch that is close to the pitch of the target.

Embodiments of the invention include methods and target arrangements configured to take advantage of specially constructed target cells. Such cells have alignment features arranged in different layers of the cell. In particular, the alignment features are embodied in a series of periodically repeating structures that are constructed so that the pitch of the two layers of repeating features are different. Some aspects of the invention are directed to defining a set of acceptable pitch relationships between the layers of a cell and determining corresponding offsets for such cells. In one embodiment the invention establishes a set of allowed pitch relationships and the optimal offsets that correspond to the pitch relationships.

Figure 3A:
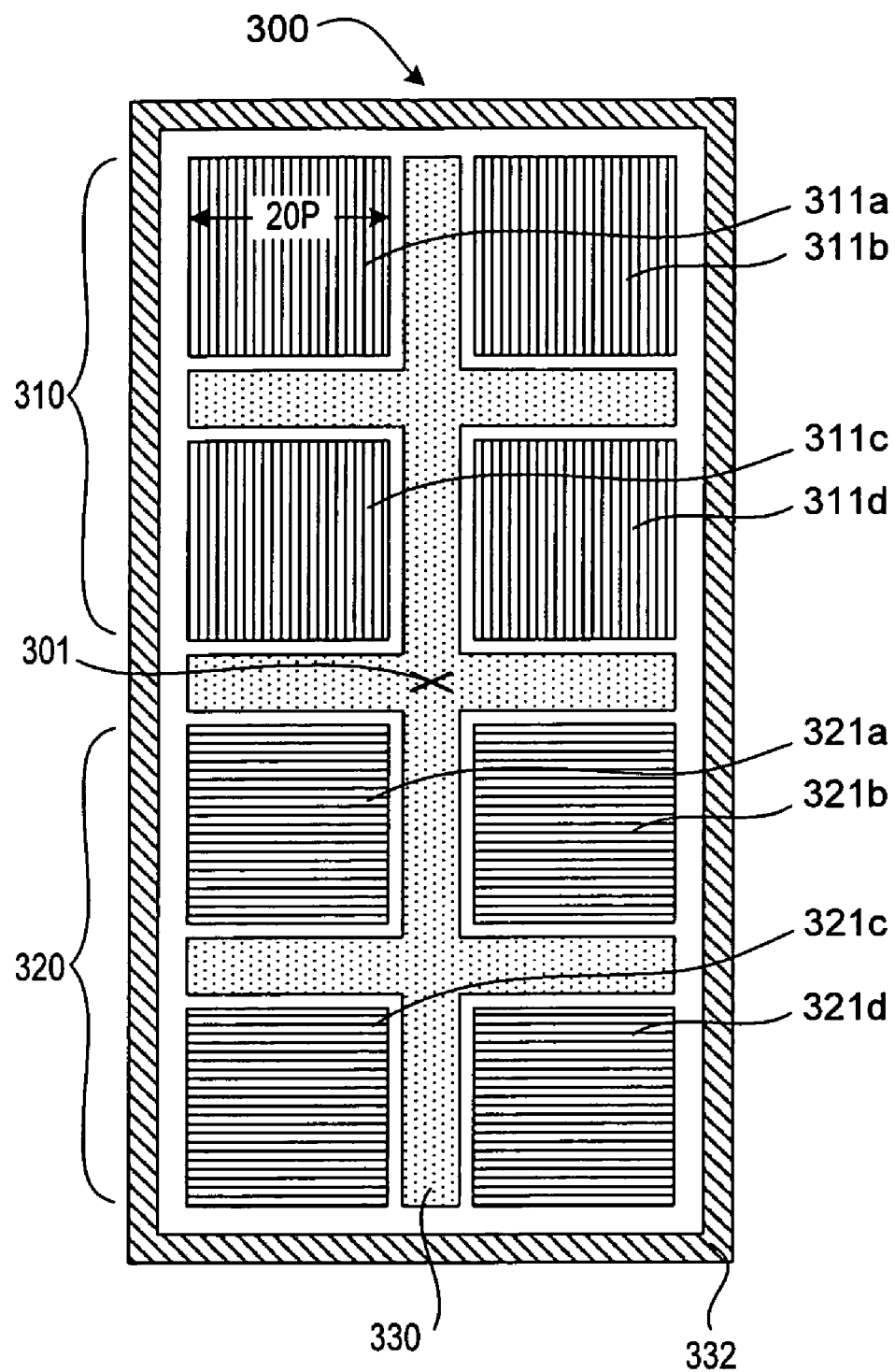
FIGS. 3(a) & 3(b) are simplified plan view depictions of SCOL targets constructed in accordance with the principles of the invention.
Figure 3B:
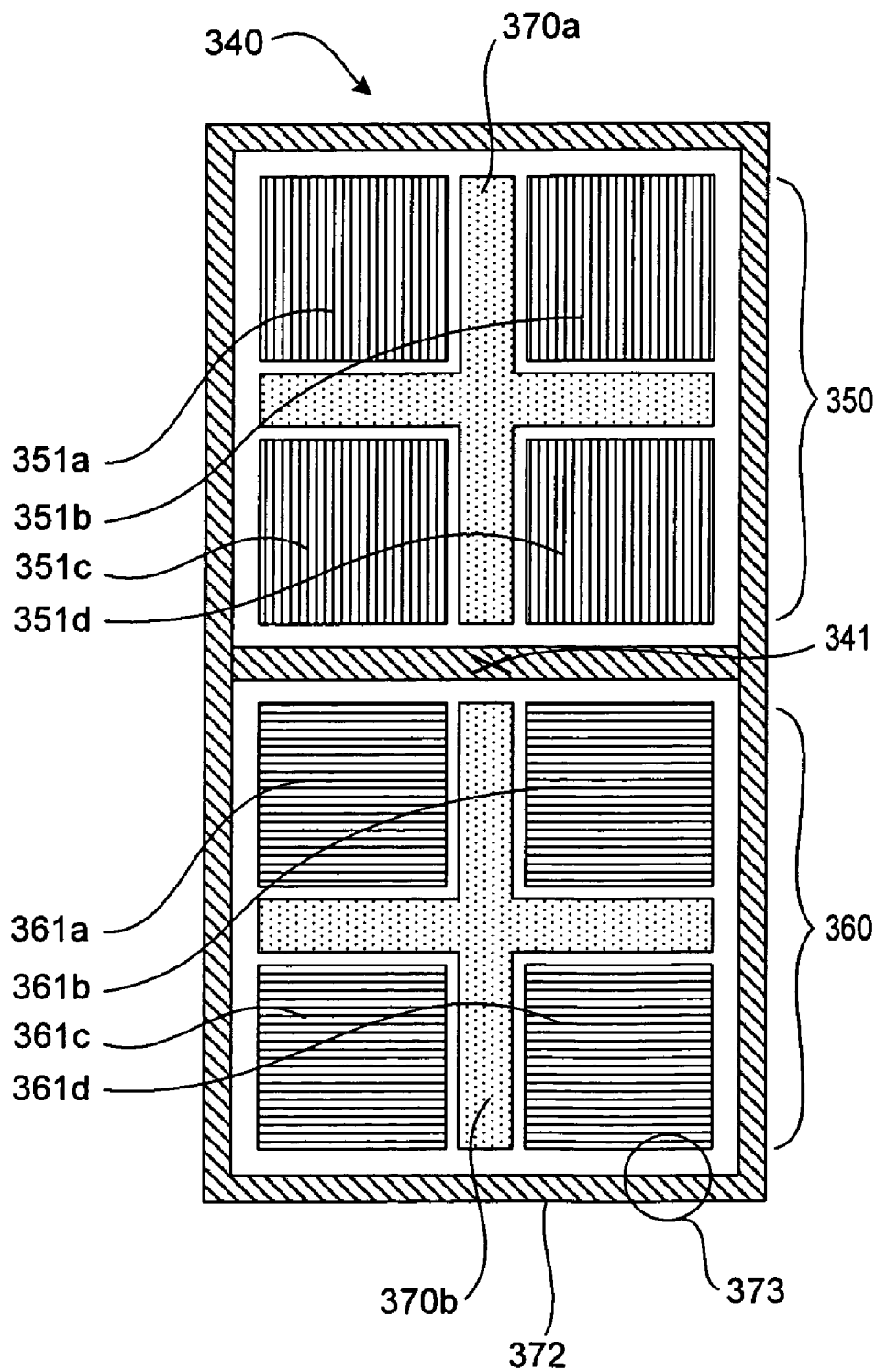

The following paragraph illustrates a few particularized embodiments for practicing the present invention. In one embodiment, (which can comprise two sets of four target cells i.e., eight target cells) a particularly suitable set of desirable offsets for each of the four cells of a target for a given pitch (p) (also referred to as the spatial periodicity of the target cell) is as follows: for pitch (p) suitable offsets are $p/4+f_0$, $-p/4+f_0$, $p/4-f_0$ and $-p/4-f_0$, where $f_0$ is a free parameter in the range of $0<f_0<p/4$. FIGS. 3(a) and 3(b) provides examples of simplified schematic depictions of a pair of four-cell target arrangements suitable for use in some embodiments of the invention.

Figure 8:
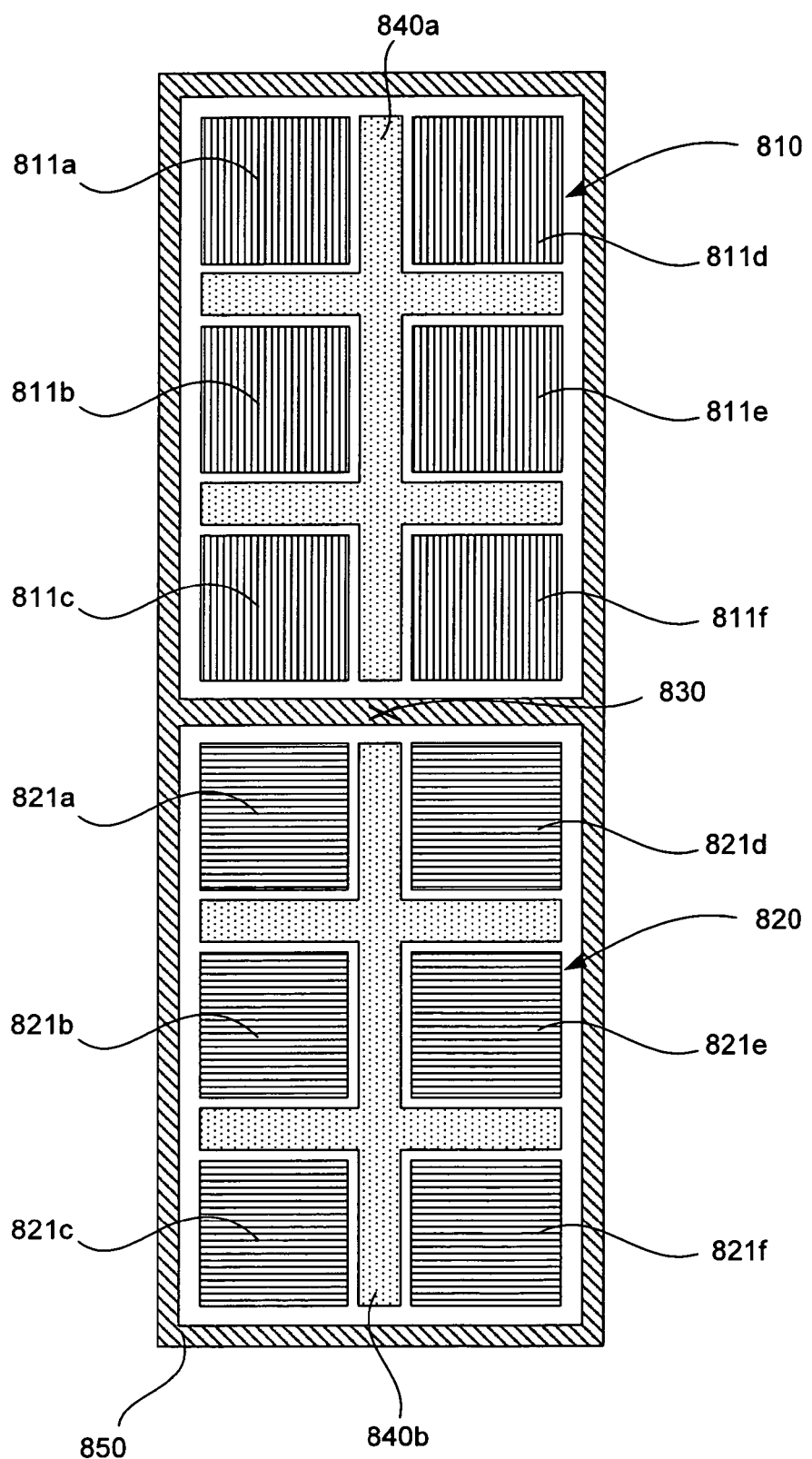
FIG. 8 is another simplified plan view depiction of a SCOL target embodiment constructed in accordance with the principles of the invention.

In another embodiment, depicted in FIG. 8, a pair six target cell sets (i.e., twelve target cells) is shown. For such an embodiment, a suitable set of desirable offsets for a given pitch (p) is 5p/12, -p/12, p/4, -p/4, p/12 and -5p/12 for each one of the six cells. The inventors point out that for such targets, the free parameter is not needed. FIG. 8 provides a simplified schematic depiction of a six cell target arrangement suitable for use in some embodiments of the invention. One set of six cells is arranged in each perpendicular axis of the target. In other embodiments where the layers of the target cells have different pitches for each of the two layers of features, other offset values are generally employed.

Due to the periodicity of SCOL signals, the resulting signals produced by a given overlay scheme is somewhat ambiguous (i.e., a selected set of phase shifted patterns can look identical to one another). This means that SCOL signal is generally determinable up to an integer multiple of p/2. In many cases this may not pose a serious problem. However, in many other cases this ambiguity produces a degree of uncertainty that produces an overlay estimate of insufficient accuracy. In such case the signal ambiguity is unacceptable.

Thus, in further embodiments, methods and structures are contemplated to resolve the ambiguous nature of the signals. In one embodiment, this ambiguity is resolved by adding some box-like structures (sometimes referred to as (BiB) or box-in-box structures) that can be employed to obtain a rough measurement of the overlay offset. Although such measurements are less accurate than the periodic measurements made above, they are generally sufficiently accurate to resolve a P/2 ambiguity in the previously described approach. Some embodiments of the present invention utilize specific designs for box-like structures to enable the resolution of such ambiguity.

A General Process for Determining Overlay Error

The following brief description outlines one embodiment for determining an overlay alignment error in accordance with the principles of the invention.

Figure 2G:
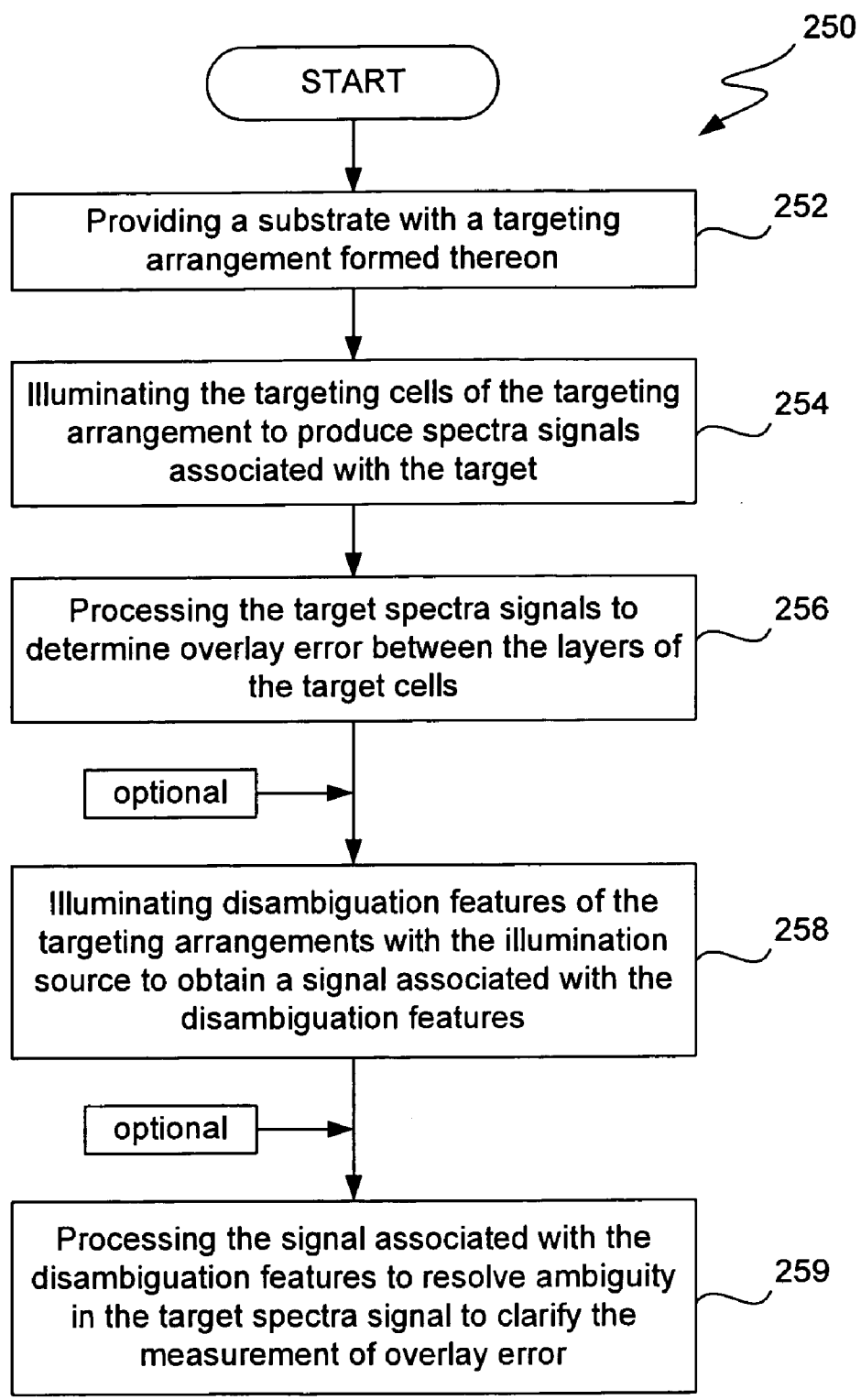
FIG. 2(g) is a simplified flow diagram illustrating an embodiment of determining overlay error in accordance with the present invention.

Referring to the simplified flow diagram 250 illustrated in FIG. 2(g) the following discussion relates to a method for determining an overlay error between layers of a sample. A substrate having layers formed thereon is provided (Step 252). Such substrates are of a type known and used by those of ordinary skill. The substrate of this embodiment includes a target arrangement formed thereon. The target arrangement comprising a plurality of target cells constructed such that each cell has a first and a second layer with a set of periodic features configured such that the periodic features of the first layer have a different pitch than the periodic features of the second layer. The layers of the target cells are generally associated with the layers of the substrate.

The target cells are illuminated by an illumination source to obtain spectra for each of the target cells (Step 254). This illumination of the target cells produces a number of spectra which are distinct and depend on which target cell is illuminated and the extent of any misalignment in the layers. The spectra are received by sensors which then provide an associated signal. These signals are processed using a processor and any overlay error between the first and second layers is determined using information obtained using the spectra obtained for each of the target cells (Step 256).

For some embodiments this is the end of the process. Due to the nature of the foregoing Steps 542-256 and the periodic nature in the signal obtained, there can be some ambiguity in the results and a certain indeterminacy in the degree of overlay error can result. The following optional process steps can be used to clarify the resulting ambiguities and in some embodiments this may be a desirable result.

In such embodiments, Step 252 includes providing a target arrangement that further includes disambiguation features arranged between the target cells, the disambiguation features configured to enable signal ambiguities caused by the generation of the periodic signal to be resolved. Although, the accuracy obtainable with the disambiguation features alone is quite a bit less than that obtainable within the target cells described above, it is generally enough to resolve the periodic ambiguity inherent in the target cells.

Step 258 includes illuminating the disambiguation features with the illumination source to obtain a signal associated with the disambiguation features. Generally, this signal is an image signal. In Step 259 the ambiguity is resolved by a comparison of disambiguation signals to determine the extent of the overlay error. In one example, a disambiguation feature can be imaged and then measurements taken as the feature is rotated about an axis of symmetry and then a rough estimate of overlay error determined.

Certain particular aspects of the above description are described in detail in the following paragraphs.

SCOL Targets having Two Different Values of the Pitch

Embodiments of the invention can include SCOL targets having different grating pitches for the top and bottom gratings. The differing grating pitch values for the bottom and top gratings pitch can be defined as, $p_1$ and $p_2$, respectively. The relationship between the pitch values are selected to enable the resulting scatterometry signal to remain periodic as a function of the overlay.

In one embodiment, such a periodic function can be obtained where there is a specific predetermined relationship between the pitches of the layers. This relationship can be satisfied by the following condition: $n_1 p_1 = n_2 p_2$ and where the relationship $p_1/p_2$ defines a rational number. In such case, values for "$n_x$" are selected as integer values (such as in an example embodiment where $p_1$ and $p_2$ are given as integers values, for example, in nanometers). Thus, both $n_1$ and $n_2$ comprise integer values. The values for "$n_x$" are also selected so that they satisfy the relationship $n_1 p_1 = n_2 p_2$.

In other words, the relationship $p_1/p_2 = n_2/n_1$ is selected to be a rational number. In one embodiment, $n_1$ and $n_2$ are selected as "Minimal Integers" that satisfy the relation $P = n_1 p_1 = n_2 p_2$, where P is defined as the "spatial periodicity" of the combined structure of the two gratings (or the cell associated with the two gratings) also referred to as the periodicity of the cell.

Generally, the periodicity of any scatterometry signal is not equal to "spatial periodicity" P of the combined structure of the two gratings.

The following case illustrates a method of determining p. The example begins with pitch values (e.g., $p_1$, $p_2$). The bottom grating has a pitch of 200 nm (nanometers) and the top grating has a pitch of 300 nm. To satisfy the condition $n_1 p_1 = n_2 p_2$ the following are true. Where p=200 nm and $p_2$=300 nm then $n_1$ can equal 3 and $n_2$ can equal 2 and thereby satisfy the condition. Also, the following condition is to be satisfied $P = n_1 p_1 = n_2 p_2$ to define a spatial periodicity P. Accordingly, the spatial periodicity P of the target (or cell) is 600 nm. Additionally, the Greatest Common Divisor (GCD) of $p_1$ and $p_2$ is 100 nm (100 being the greatest divisor common to 200 and 300). Generally, this GCD defines the periodicity of the signal p as 100 nm.

Figure 2H:
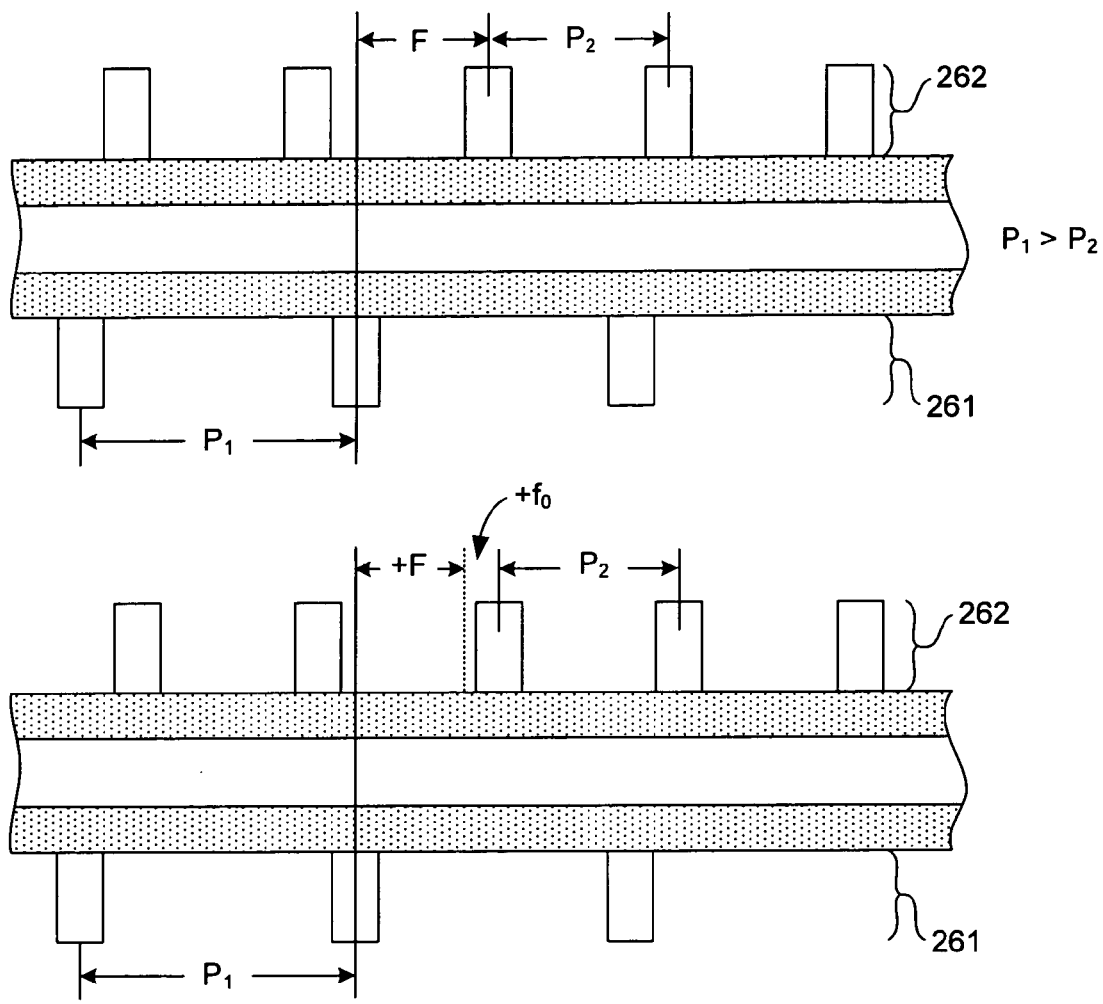
FIG. 2(h) is a set of simplified side view illustrations showing an example offset and the pitch differentials between a first and second layer of periodic features of a target cell constructed in accordance with the principles of the present invention.

Thus, using the information of paragraphs [0037] and [0064] above, the optimal values of the intentional offsets of the 4 cells of the target are $p/4+f_0$, $-p/4+f_0$, $p/4-f_0$ and $-p/4-f_0$, where $p=GCD(p_1,p_2)$ and where $f_0$ is less than $p/4$. In the preceding case $p=(GCD)=100$ nm. Therefore $p/4=25$ nm and $f_0$ should be chosen as some value less than 25 nm. This is depicted in the simplified diagram of FIG. 2(h) which shows two layers of periodic features 261, 262 arranged in different layers of a substrate. The spacing between the features of a first layer 261 of periodic features defines the pitch $p_1$ for the first layer. Similarly, the spacing between the features of a second layer 262 of periodic features defines the pitch $p_2$ for a second layer on the target. In this depiction the pitch $p_1$ for the first layer is greater than the pitch $p_2$ for the second layer. Additionally, a portion of the offset F is depicted. This value F is measured for example from the centerline of a feature in the first layer to the centerline of a feature in the second layer. Additionally, the other portion of the offset $f_0$ is shown as added to (or subtracted from) F. The offsets in the present invention are determined as above (+F+$f_0$, +F-$f_0$, -F+$f_0$, -F-$f_0$) and used to define a set of cells defining a targeting arrangement. Generally, this means eight cells per arrangement, four for each direction (of which the directions are perpendicular to each other).

The effectiveness of this approach is enhanced in embodiments having a sufficiently large cell size. The spatial periodicity P of the cell plays a role here. Additionally, a large number of spatial periods P should be contained in the illumination spot directed onto the target. In preferred embodiments, a cell size of about 15P or greater is generally preferred. Such a cell size can be used to in order to avoid finite size effects and poor repeatability. In another embodiment, each cell is at least 20P across ("across" in this context means in the direction perpendicular to the length of the features forming the cell.)

Referring to Step 252 of the flow diagram (FIG. 2(g)), a method embodiment for determining overlay in accordance with one embodiment of the present invention can include the following. A first set of target cells includes four targets A, B, C, and D which are designed to have offsets $X_a$ through $X_d$. The target offsets are, for each target respectively, $X_a = p/4 + f_0$, $X_b = -p/4 + f_0$, $X_c = p/4 - f_0$ and $X_d = -p/4 - f_0$, where spatial periodicity value for the resultant target signal $(S_p) = p = GCD(p_1, p_2)$ and where $f_0$ is less than $p/4$.

In Step 254, an incident radiation beam is directed towards each of the four targets A, B, C, and D to generate four spectra $S_A$, $S_B$, $S_C$, and $S_D$ from the four targets in which can be measured. The spectra generation operations may be carried out sequentially or simultaneously depending on the measurement system's capabilities. The incident beam may be any suitable form of electromagnetic radiation, such as laser or broadband radiation. Examples of optical systems and methods for measuring scatterometry signals to determine overlay may be found in (1) U.S. patent application, having patent Ser. No. 09/849,622, filed 4 May 2001, entitled "METHOD AND SYSTEMS FOR LITHOGRAPHY PROCESS CONTROL", by Lakkapragada, Suresh, et al. and (2) U.S. patent application, having application Ser. No. 09/833,084, filed 10 Apr. 2001, entitled "PERIODIC PATTERNS AND TECHNIQUE TO CONTROL MISALIGNMENT", by Abdulhalim, et al. These applications are herein incorporated by reference in their entirety.

Many embodiments of suitable measurement systems and their use for determining overlay error are further described in detail in the applications incorporated above. But, in short, the spectra are measured and processed to obtain overlay error information (Step 256). The inventors contemplate that in various embodiments of the present invention, the spectra $S_A$, $S_B$, $S_C$, and $S_D$ (and any additional spectra that may be present) could include any type of spectroscopic ellipsometry or reflectometry signals, including: tan($\Psi$), cos($\Delta$), Rs, Rp, R, $\alpha$ (spectroscopic ellipsometry "alpha" signal), $\beta$ (spectroscopic ellipsometry "beta" signal), ((Rs−Rp)/(Rs+Rp)), etc.

Spectrum $S_B$ ($-p/4 + f_0$) can then be subtracted from spectrum $S_A$ ($+p/4 + f_0$), and spectrum $S_D$ ($-p/4 - f_0$) can then be subtracted from spectrum $S_C$ ($+p/4 - ff_0$) to form two associated difference spectra $D_1$ and $D_2$. Next, a difference spectrum property $Prop_1$ is obtained from the difference spectra $D_1$ and a difference spectrum property $Prop_2$ is obtained from the difference spectrum $D_2$. The difference spectra properties $Prop_1$ and $Prop_2$ are generally obtained from any suitable comparable characteristics of the obtained difference spectra $D_1$ and $D_2$. The difference spectra properties $Prop_1$ and $Prop_2$ may also each simply be a point on the each difference spectra $D_1$ or $D_2$ at a particular wavelength. By way of other examples, difference spectra properties $Prop_1$ and $Prop_2$ may be the result of an integration or averaging of the difference signal, equal the average of the SE alpha signal, equal a weighted average which accounts for instrument sensitivity, noise or signal sensitivity to overlay, or many other parameters. As is known to those having ordinary skill in the art, the comparison spectra can be obtained and processed using many different methods.

After difference spectra properties $Prop_1$ and $Prop_2$ are obtained, the magnitude and direction of an overlay error E can then be calculated directly from the difference spectra properties $Prop_1$ and $Prop_2$. In one embodiment, a linear approximation can be performed based on the difference spectra properties $Prop_1$ and $Prop_2$ to determine the overlay error E, while in another technique the difference spectra properties $Prop_1$ and $Prop_2$ can be used to approximate a sine wave function or other periodic function which is then used to determine the overlay error E. For example, linear regression techniques can be used. In another example, the overlay result may be obtained by a statistical calculation (e.g. averaging or weighted averaging) of overlay results obtained from properties of multiple wavelengths or multiple wavelength ranges.

Many suitable processes for determining the error E in overlay alignment are detailed in the incorporated references and related applications and need not be described here. The targets may be used to determine overlay of structures located at least partially in more than one layer, but could also be used to determine overlay of structures located substantially in a single layer.

Additional optional features used to resolve signal ambiguity as indicated on FIG. 2(g)(e.g., 258, 259) are discussed in the following paragraphs.

The SCOL Ambiguity Problem

Such techniques as described above are useful and accurate for a determination of an overlay error. However, as also mentioned briefly above, the periodicity of SCOL signals commonly leads to an ambiguity of n·p/2 in the overlay, where n has an integer value. The inventors address this issue by adding disambiguation features to enhance the SCOL target. Such disambiguation features enable coarse measurements of overlay offset. Such coarse measurements are enabled by adding disambiguation target structures in the two layers and using, for example, a box-in-box type algorithm to generate a coarse measurement of the overlay error to clarify the ambiguity in the cell measurements.

Thus, such added features provide a disambiguation quality for the target arrangement. In general, these disambiguation features need only provide a coarse alignment and be arranged symmetrically about an axis of symmetry for the target (by symmetric, the inventors mean that the target should be symmetric if the target is rotated through 180°). In one implementation the added target structures can be large bar-like structures. The bar can comprise raised structures or trenches. Any large easily imageable structure will suffice. Two examples of structures which can be used for this purpose are shown in the target arrangements shown in FIGS. 3(a) and 3(b).

FIG. 3(a) depicts a target 300 having two sets 310, 320 of four cells each (311a, 311b, 311c, & 311d and 321a, 321b, 321c, & 321d, respectively). It is of course noted that the features of each set (e.g., 311a, 311b, 311c, & 311d) are perpendicular to the features of the other set (e.g., 321a, 321b, 321c, & 321d). Although each of the cells are depicted as being square, this need not be the case. Also, as depicted, the cells of each set are grouped together next to one another. The inventors point out that this need not be the case. The cells are sized as explained above. In this example, cell 311b extends about 20P in a direction perpendicular to the direction the features extend.

To resolve ambiguity in the periodic spectra signals obtained by illuminating the target cells (e.g., 311b), a set of disambiguation features are added to the target. The disambiguation features can comprise a set of coarse overlay features arranged symmetrically about an axis of symmetry 301. A first set 330 of coarse overlay "bars" is arranged in one of the layers (for example, the same layer as the bottom features of the cells), while a second set 332 of coarse overlay "bars" is arranged in the other one of the layers. Such structures should be sized so that they can be optically resolved with an imaging system used with the apparatus. The idea being that the features are large enough to be optically resolvable with a common imaging system thereby enabling easy and efficient navigation to the relevant sites (one example of a suitable navigation optical system can be included on a SCOL system of the present invention). Also, coarse overlay measurements made in accordance with the principles of the invention generally need not be more accurate than slightly less than p/4 (where p=GCD ($p_1,p_2$) for the cell) or in some cases p/12. Generally, this means that the coarse overlay measurements need only be accurate to about 10-20 nanometers to satisfy the accuracy requisite to resolve the ambiguity generated by the cells. The bars (330, 332) are generally sized and positioned in the space available. In the depicted implementations the bars are located between the cells and at the outer edge of the target. Such positioning is convenient and does not waste additional space. As mentioned above, the only true requirement as to the size of the bars is that they be large enough to be optically resolved with the imaging system conducting the measurements. Bars on the order of about 0.5µ (micrometers) to about 1µ are easily suitable for the purposes of the invention. However, both bigger and smaller dimensions for the bars are contemplated by the inventors.

FIG. 3(b) depicts an alternative target 340 embodiment also having two sets 350, 360 of four cells each (351a, 351b, 351c, & 351d and 361a, 361b, 361c, & 361d, respectively). As before, the features of each set of cells are perpendicular to the features of the other set of cells. Again a set of disambiguation features is added to the target. As before the disambiguation features can comprise coarse overlay features arranged symmetrically about an axis of symmetry 341. As depicted here, a first set 370a, 370b of coarse overlay "bars" is arranged in one of the layers. Also, a second set 372 of coarse overlay "bars" is arranged in the other of the layers. In this embodiment, the second set 372 of coarse overlay is in a "domino"-type configuration with one of the bars bisecting the cells of the target. As before, the disambiguation features should be sized so that they can be optically resolved with the imaging system used. The bars are generally sized as described in FIG. 3(b).

Figure 4:
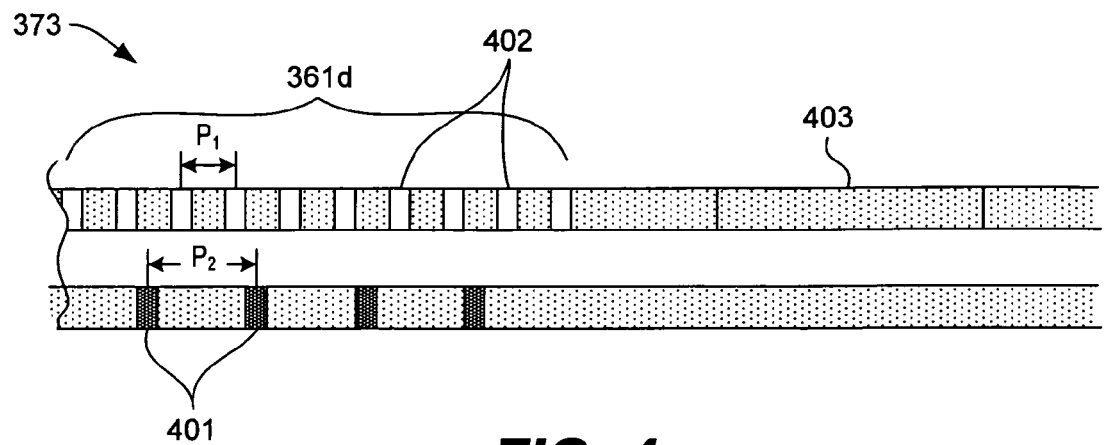
FIG. 4 is a simplified schematic side section view of a portion of the target depicted in FIG. 4 and constructed in accordance with the principles of the invention.

A small portion 373 of one of the targets 340 is illustrated in simplified side sectional view in FIG. 4. Which shows the features and pitch $p_2$ of periodic features 401 comprising a portion of a lower layer of cell 361d. And also, the features and pitch $p_1$ of periodic features 402 comprising a portion of an upper layer of cell 361d. Also, shown is a portion of the coarse disambiguation feature (bar) 372 which in this depiction is shown in the upper layer.

Figure 5:
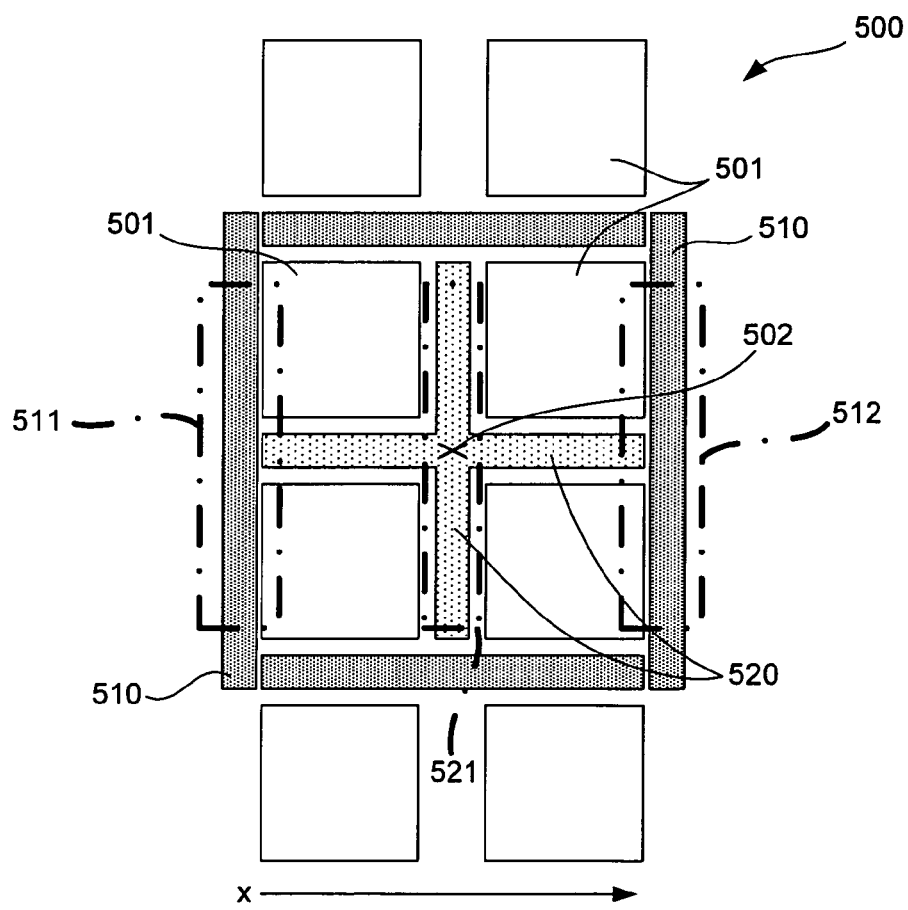
FIG. 5 is a simplified plan view depiction of a SCOL target constructed in accordance with the principles of the invention and showing ROI's.

FIG. 5 provides a brief illustration of one embodiment used to disambiguate SCOL measurements with coarse disambiguation features. FIG. 5 depicts a target 500 embodiment also having sets of target cells 501 arranged as discussed in previously described embodiments. A set of disambiguation features is added to the target (510, 520). Here, each of the disambiguation features comprise coarse overlay features arranged symmetrically about center of symmetry 502. In this case, such symmetry means that the disambiguation features can be rotated 180 degrees about the center of symmetry 502 and maintain the same pattern and orientation. As depicted here, a first set 510 of coarse overlay "bars" is arranged in one of the layers. Also, a second set 520 of coarse overlay "bars" is arranged in another layer.

The following describes one example for using the coarse overlay to obtain a measurement in the X-direction. Using an imaging tool the coarse overlay "bars" 510, 520 are imaged using a sensor (for example a CCD array). Regions of interest (ROI) are the defined for the two layers. The two ROIs correspond to portions of the overlay "bars" 510, 520. For example, ROI (defined by the dotted line) 521 corresponds to the second set 520 of coarse overlay "bars". And another ROI (defined by the dotted/dashed line) 511 corresponds to the left hand portion of the first set 510 of coarse overlay "bars". Whereas, ROI (defined by the dotted/dashed line) 512 corresponds to the right hand portion of the first set 510 of coarse overlay "bars". The bars are illuminated by the inspection tool and scattered light signals are received at the sensor. The received signals are then processed for each ROI. For example, the signals can be received by a CCD sensor, and then each CCD pixel is processed in a summing operation for each ROI (projection operation) to obtain a one dimensional measurement for each ROI. This results in three one-dimensional projected signals (one for each ROI 511, 512, 521).

The projected signals are used to find the position of the center of symmetry for each set of coarse overlay bars for each layer. The center of the symmetry for the outer portions of the coarse overlay bars 510 is found from the projected signals obtained from the outer ROI's (511, 512), while the center of symmetry of the inner coarse overlay bar 520 is found from the projected signal obtained from the inner ROI 521. Commonly used algorithms known to those having ordinary skill in the art can be used to find the centers of symmetry based on the signals obtained. In one embodiment, the signals are processed using standard correlation algorithms. A degree of alignment between the two layers can be determined, for example, by comparing the distance between the determined centers of symmetry for the inner coarse overlay bar 520 and outer coarse overlay bars 510.

In forgoing embodiment there is some degree of optical cross talk between the coarse overlay structures and the neighboring structures (in particular, the neighboring cells and also adjacent periodic device structures that can also be formed on the substrate. The presence of these periodic structures can strongly affect the measurement of these signals and in particular can affect the accuracy of the coarse overlay measurements in an unpredictable way. The following paragraphs alternate approaches affected less by this phenomena.

While the forgoing embodiments are suitable for many applications, another approach may be used that addresses some of the limitations and sources of error that may occur in the prior embodiments. For example, the foregoing method as implemented assumes certain perfect symmetry for the received signals. For example, in the depicted operation, the first set 510 of coarse overlay bars is generally assumed to produce a signal symmetric as reflected about a Y-axis for the target. Any asymmetry in this signal will bias the coarse overlay measurement. A major source of such asymmetry is the optical interaction of the bar 510 with its surroundings. In the case of a SCOL target, the surroundings include gratings on the right and left hand sides of the bar (501), which differ from each other. Additionally, the semiconductor pattern itself (which is formed around the target) introduces bias in the symmetry which is difficult to accurately compensate for.

A standard overlay algorithm can be used to reduce the ambiguity of such signals but the inventors believe additional accuracy can be obtained using the features of the following further described embodiments. The previously discussed approaches involve finding the center of symmetry of each of the coarse overlay structures along their narrow sides.

However, beyond these implementations the inventors have constructed additional embodiments capable of increased clarity of measurement.

Again, since the environment of each of these structures (bars) is different on each of the two sides, its center of symmetry can be biased by many nanometers. For example, a bar between two cells of an overlay target is affected by cross talk induced by its proximity to the two cells. Since the two cells are different (they have different offsets), their asymmetric cross talk with the bar can affect the signal in a matter that appears to shift the center of symmetry of the bar. In one approach, this problem can be avoided by increasing the distance between the coarse overlay structures and their surroundings to several microns. However, this solution comes at the expense of significantly increasing target size. Given the extreme premium placed on space in a semiconductor die this is not a preferred solution to the problem.

The inventors posit that it is possible and advantageous to find the center of symmetry of the coarse overlay structures along their wide sides as well as the narrow sides. This offers the ability to determine these measurements at an orientation of 90° from the measurements on the narrow sides. This offers an opportunity to reduce the cross-talk from adjacent periodic features without a significant increase in target size.

Figure 6:
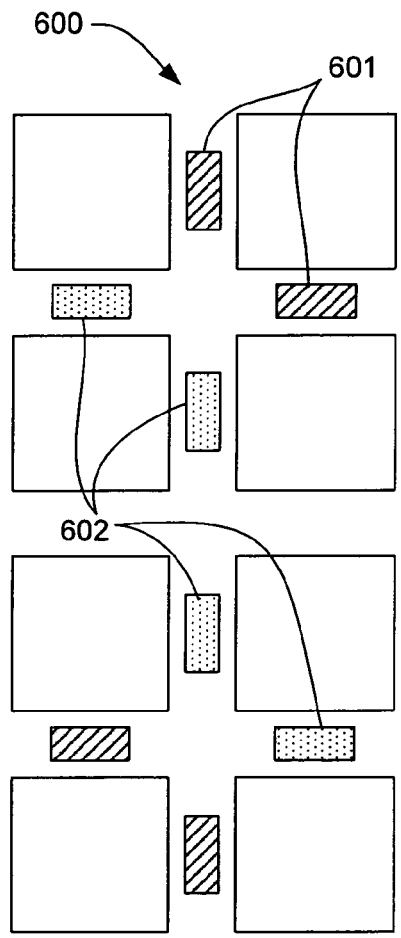
FIG. 6 is a simplified plan view depiction of another SCOL target embodiment constructed in accordance with the principles of the invention.

Referring to FIG. 6, the inventors describe one embodiment 600 of a target that can achieve reduced cross-talk from adjacent features without sacrificing additional space. As depicted here, a first set 601 of coarse overlay "bars" is arranged in one of the layers. Also, a second set 602 of coarse overlay "bars" is arranged in the other of the layers. In this embodiment, the coarse overlay bars are smaller (shorter) than those previously disclosed. In particular, all sides of the bars are exposed to allow each edge to be imaged and used for disambiguation.

These structures still have significant cross talk with the SCOL cells. Worse still, this cross talk distorts the optical signal to the extent that it can appear to the shift the centers of symmetry for the target. For example, the centers of symmetry of horizontal bars are shifted almost only in the vertical direction, whereas the centers of symmetry of vertical bars are shifted almost only in the horizontal direction. The measurement consists of finding the centers of symmetry of horizontal structures along the horizontal direction and of the vertical structures along the vertical direction. Since the positions of these centers of symmetry are not significantly affected by the cross talk effect, the bias in their positions should be small, and the inventors can take advantage of the fact that such a measurement would have an accuracy to within about 10-20 nanometers, good enough to achieve the requisite accuracy needed in the coarse overlay measurement.

Figure 7:
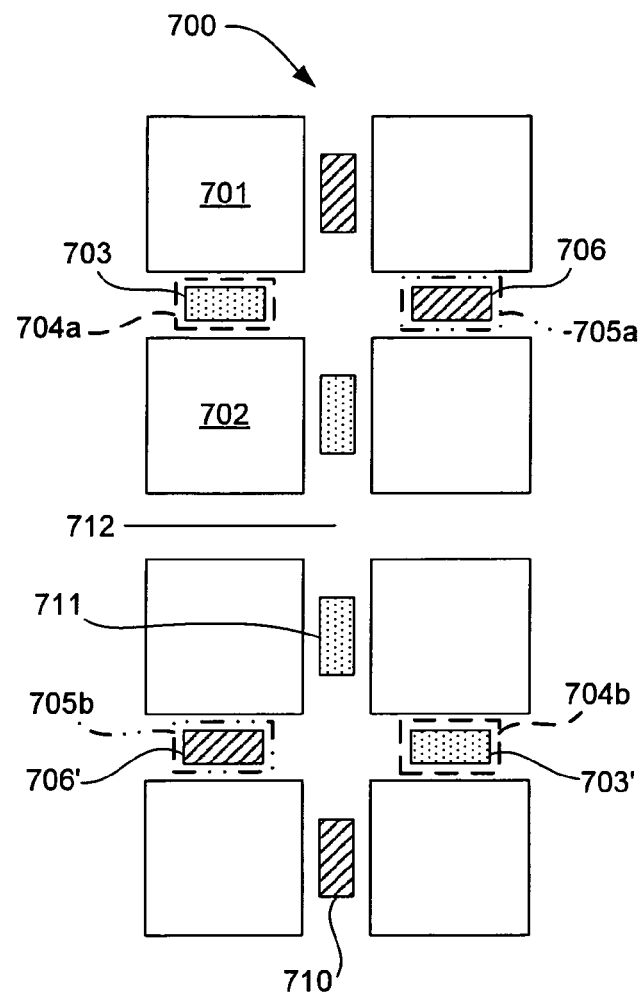
FIG. 7 depicts a SCOL target such as embodied in FIG. 6 depicting ROI's as used in accordance with the principles of the invention.

In this embodiment, the coarse overlay measurement is done similarly to that disclosed in the previous embodiment. However, the asymmetry induced by the surroundings is significantly reduced. FIG. 7 depicts a target 700 embodiment having sets of target cells (701, 702 and so one) arranged as discussed in previously described embodiments. The disambiguation features (703, 706, and so on) are shortened not extending beyond the edges of the target cells. Sets of disambiguation features are added to the target. Here the disambiguation features comprise coarse overlay features arranged symmetrically about an axis of symmetry 712. As depicted here, a first set 710 of coarse overlay bars is arranged in one of the layers (these are depicted in the cross-hashed boxes 710). Also, a second set 711 of coarse overlay bars is arranged in another layer (these are depicted in the speckle-filled boxes 711).

The following describes one example for using the coarse overlay to obtain a measurement in the X-direction. Using an imaging tool the coarse overlay bars are imaged using a sensor. ROI's are the defined for the two layers. For example, here two ROIs 704a, 704b correspond to portions of the overlay "bars" 703, 703' (defined by the dashed/dotted line 704a, 704b). And, two other ROIs 705a, 705b correspond to portions of additional overlay bars 706, 706' (defined by the dashed/dotted line 705a, 705b) formed in another layer. As before, the bars are illuminated by the inspection tool and scattered light signals are received at the sensor. The received signals are then processed for each ROI. For example, a summing operation for each ROI (projection operation) to obtain a one dimensional measurement for each ROI (704a, 704b, 705a, 705b). This results in four one-dimensional projected signals.

The projected signals are used to find the position of the center of symmetry for each set of coarse overlay bars for each layer. The center of the symmetry for the coarse overlay bars 703, 703' is found from the projected signals obtained from the ROI's (704a, 704b), while the center of symmetry of the other coarse overlay bars 706, 706' is found from the projected signal obtained from the ROI's (705a, 705b). As before, commonly used algorithms known to those having ordinary skill in the art can be used to find the centers of symmetry based on the signals obtained. In one embodiment, the signals are processed using standard correlation algorithms. A degree of alignment between the two layers can be determined by comparing the positions of the determined centers of symmetry for each set of measurements.

As shown in FIG. 7, the reason for this improvement in accuracy is that the different gratings (target cells 701, 702, for example) in the vicinity of the affected ROI (in this example 703) are located above and below the affected ROI rather than to the left and right. Since the gratings (target cells) are configured to be homogeneous along the X-direction they do not induce asymmetry in the signals along the X-direction. This improves the symmetry of the signals considerably and gives rise to a more accurate coarse overlay measurement.

Of course a similar consideration applies to coarse overlay measurements in the Y-direction. In this case the signals are projected in the perpendicular direction giving rise to a one-dimensional signal which depends only on the Y-coordinate. In such analysis and measurement, a first target the surroundings of the ROI's are different gratings at the top and bottom of the ROI's which induce asymmetry in the Y-direction. In a second target, the gratings would now be to the left and right of the ROI's and therefore not induce asymmetry along that direction.

The inventors take this opportunity to point out that many other different target arrangements can be constructed an employed in accordance with the principles of the invention. For example, six cell targets (a set of six cells) can be used to achieve metrology measurements in accordance with the principles of the invention. For example, FIG. 8 depicts a simplified implementation of a six-cell target. The inventors note that such a six-cell target can be used together with another six-cell target to form a larger twelve-cell target, much in the same manner that the two (2) four-cell targets can be employed to form an eight cell target arrangement. One embodiment of such an implementation is what is depicted in FIG. 8.

In the embodiment depicted in FIG. 8, a pair of six-cell sets are configured to form a twelve cell target. Much the same as the previously described embodiments a set of cells is described hereinbelow. FIG. 8 depicts an target 800 embodiment also having two sets 810, 820 of six cells each (811a, 811b, 811c, 811d, 811e & 811f and 821a, 821b, 821c, 821d, 821e & 821f, respectively). As described with respect to the eight cell arrangements, the features of each set of cells are perpendicular to the features of the other set of cells (i.e., set 810 is perpendicular to set 820). Again a set of disambiguation features can be added to the target. As before the disambiguation features can comprise coarse overlay features arranged symmetrically about an axis of symmetry 830. As depicted here, a first set 840a, 840b of coarse overlay "bars" is arranged in one of the layers. Also, a second set 850 of coarse overlay "bars" is arranged in the other of the layers. In this embodiment, the second set 850 of coarse overlay is in a "domino"-type configuration with one of the bars bisecting the cells of the target. As before, the disambiguation features should be sized so that they can be optically resolved with the imaging system used. The bars are generally sized as described elsewhere herein.

In this depicted embodiment, which can comprises two sets of six cells arranged in two perpendicularly oriented sets, a suitable set of desirable offsets for the cells (for a given pitch p) is 5p/12, –p/12, p/4, –p/4, p/12 and –5p/12. As indicated above, for such a twelve target layout, no free parameter is required. In other embodiments where the layers of the target cells have different pitches for each of the two layers of features, other offset values are generally employed.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that many different arrangements and configurations can be established for constructing overlay targets configured in accordance with the principles of the invention. Although only a few configurations are expressly disclosed herein, it should be appreciated by anyone having ordinary skill in the art that, using the teachings disclosed herein, many different target configurations can be implemented and still fall within the scope of the claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A target arrangement for determining overlay alignment on a substrate, the target arrangement comprising:
   a substrate having at least two layers formed thereon;
   a target arrangement formed on the substrate, the target arrangement comprising two sets of target cells,
      a first set of target cells configured in a first set of at least two layers of periodic features and configured to generate high resolution periodic overlay signals associated with the overlay between the first set of at least two layers of periodic features; and
      a second set of target cells configured in a second set of at least two layers of periodic features and configured to generate high resolution periodic overlay signals associated with the overlay between the second set of at least two layers of periodic features; and
      a plurality of optically resolvable disambiguation features, where a plurality of the optically resolvable disambiguation features includes a first set of coarse overlay bars and a second set of coarse overlay bars, where the coarse overlay bars are configured such that the sides of the coarse overlay bars are exposed to allow each edge to be imaged, and the plurality of the optically resolvable disambiguation features is arranged between the target cells of the target arrangement and wherein at least one of the plurality of the optically resolvable disambiguation features bounds the target cells, the disambiguation features configured to be optically observed to enable the resolution of signal ambiguity caused by signals produced by illuminating the cells.

2. The target arrangement of claim 1, wherein:
the first set of cells includes at least a first layer having a first set of periodically arranged features arranged above a second layer having a second set of periodically arranged features and said first and second sets of periodically arranged features are offset relative to each other; and
the second set of cells includes at least a third layer having a third set of periodically arranged features arranged above a fourth layer such that the third set of periodically arranged features and said fourth set of periodically arranged features are offset relative to each other.

3. The target arrangement of claim 2 wherein
the first set of periodic features has the same pitch as the second set of periodic features,
the third set of periodic features has the same pitch as the fourth set of periodic features; and
the periodically arranged features of the first and second layers of the target cells each include an offset X defined by a large offset parameter F and a smaller free parameter $f_0$ wherein the free parameter is greater than 15% of the pitch and is less than 25% of the pitch.

4. The target arrangement of claim 2 wherein
the first set of periodic features has a different pitch than the second set of periodic features.

5. The target arrangement of claim 4 wherein
the first set of target cells is configured so that the first set of periodic features arranged in the first layer have a first pitch defined by a first value $n_1$ and the second set of periodic features arranged in the second Layer have a second pitch defined by a second value $n_2$ and wherein the first and second set of periodic features are defined by the relation $n_1 p_1 = n_2 p_2 = P$ wherein P defined the spatial periodicity of the first set of target cells, and
the first set of target cells further defines a greatest common denominator associated with the pitches ($n_1$, $n_2$) of the first set of target cells; and
the offset of each sell is associated with the value for the greatest common denominator and a free parameter ($f_0$).

6. The target arrangement of claim 5 wherein
the first set of target cells includes four cells, and
the second set of target cells includes four cells.

7. The target arrangement of claim 6 wherein
the four cells of each set of cells has an offset characterized by the spatial periodicity value (p) and the free parameter ($f_0$) in accordance with following relation:
in a first cell in the first set of cells the first layer is offset relative to the second layer by a value of $+P/4+f_0$,
in a second cell in the first set of cells the first layer is offset relative to the second layer by a value of $+P/4-f_0$,
in a third cell in the first set of cells the first layer is offset relative to the second layer by a value of $-P/4+f_0$,
in a fourth cell in the first set of cells the first layer is offset relative to the second layer by a value of $-P/4-f_0$; and
in a first cell in the second set of cells the third layer is offset relative to the fourth layer by a value of $+P/4+f_0$,
in a second cell in the second set of cells the third layer is offset relative to the fourth layer by a value of $+P/4-f_0$,
in a third cell in the second set of cells the third layer is offset relative to the fourth Layer by a value of $-P/4+f_0$,
in a fourth cell in the second set of cells the third layer is offset relative to the fourth layer by a value of $-P/4-f_0$;
and wherein the free parameter is defined by a value greater than zero and less than P/4.

8. The target arrangement of claim 2 wherein
the first layer of the first set of cells is the same as the third layer of the second set of cells; and
the second layer of the first set of cells is the same as the fourth layer of the second set of cells.

9. The target arrangement of claim 2 wherein
the first set of cells includes six cells, and
the second set of cells includes six cells.

10. The target arrangement of claim 9 wherein
each cell defines a spatial periodicity having a value (p) associated with a greatest common denominator for the pitches associated with each cell;
the offset of each cell is associated with the value (p) of the cell; and
wherein the six cells of each set of cells has an offset characterized by the value (p) in accordance with following relation:
in a first cell in the first set of cells the first layer is offset relative to the second layer by a value of $+p \cdot (1/12)$,
in a second cell in the first set of cells the first layer is offset relative to the second layer by a value of $+p \cdot (3/12)$,
in a third cell in the first set of cells the first layer is offset relative to the second layer by a value of $+p \cdot (5/12)$,
in a fourth cell in the first set of cells the first layer is offset relative to the second layer by a value of $-p \cdot (1/12)$,
in a fifth cell in the first set of cells the first layer is offset relative to the second layer by a value of $-p \cdot (3/12)$,
in a sixth cell in the first set of cells the first layer is offset relative to the second layer by a value of $-p \cdot (5/12)$; and
in a first cell in the second set of cells the third layer is offset relative to the fourth layer by a value of $+p \cdot (1/12)$,
in a second cell in the second set of cells the third layer is offset relative to the fourth layer by a value of $+p \cdot (3/12)$,
in a third cell in the second set of cells the third layer is offset relative to the fourth layer by a value of $+p \cdot (5/12)$,
in a fourth cell in the second set of cells the third layer is offset relative to the fourth layer by a value of $-p \cdot (1/12)$,
in a fifth cell in the second set of cells the third layer is offset relative to the fourth layer by a value of $-p \cdot (3/12)$,
in a sixth cell in the second set of cells the third layer is offset relative to the fourth layer by a value of $-p \cdot (5/12)$.

11. The target arrangement of claim 1 wherein the target arrangement the disambiguation features comprise coarse symmetric disambiguation features suitable for resolving ambiguities caused by signals produced by illuminating the cells, wherein the symmetric configuration of the disambiguation features enables coarse alignment of the disambiguation features in two perpendicular axes.

12. A target arrangement for determining overlay alignment on a substrate, the target arrangement comprising:
a substrate having at least two layers formed thereon, the layers comprising a second layer formed above a first layer;
a target arrangement formed on the substrate enabling the measurement of the overlay error between the first and the second layer, the target arrangement comprising a plurality of periodic target cells configured such that each cell has two arrays of periodic features a first array in the first layer and a second array in the second layer arranged such that there is a predetermined offset between the periodic features of first and second arrays of each target cell, each cell configured to generate an overlay signal when illuminated; and
a plurality of coarse, optically resolvable disambiguation features configured to resolve alignment ambiguities in the overlay signal generated by the illuminated target cell wherein at least a first one of the coarse disambiguation features includes a set of coarse overlay bars configured such that the sides of the bars are exposed to allow each edge to be imaged and is arranged in spaces between adjacent target cells of the arrangement and wherein a second one of the coarse disambiguation features defines the periphery of the target arrangement and surrounds the plurality of periodic target cells.

13. The target arrangement recited in claim 12 wherein the target cells are configured so that the periodic features of the first array have a different pitch than the periodic features of the second array wherein the relationship between the pitches is arranged to generate a periodic signal for the target when the target cell is exposed to an illumination source.

14. The target arrangement recited in claim 12 wherein the target cells are configured so that the periodic features of the first array have the same pitch as the periodic features of the second array.

15. The target arrangement of claim 12 wherein each disambiguation feature has at least two perpendicular edges.

16. The target arrangement of claim 12 wherein the periodic features of the top Layer of the target cells have a first pitch $p_1$ and an associated value $n_1$ and the periodic features of the bottom layer have a second pitch $p_2$ and an associated value $n_2$ wherein the relationship between the pitches is defined by the relationship $n_1 p_1 = n_2 p_2$, and wherein a spatial periodicity (P) is defined for the target cell in accordance with the relation $n_1 p_1 = n_2 p_2 = P$ and wherein the pitches are selected so that the fraction $p_1/p_2$ is a rational number.

17. The target arrangement of claim 16 wherein the predetermined offset between the periodic features of the bottom layer and the periodic features of the top layer is associated with the greatest common divisor of the values for $p_1$ and $p_2$.

18. The target arrangement of claim 16 wherein the target cells have a size dimension of at least fifteen times the spatial periodicity (P) for the cell.

19. The target arrangement of claim 12 wherein the coarse disambiguation features comprise at least two optically resolvable disambiguation features arranged between the periodic target cells and configured to resolve signal ambiguities caused by the generation of overlay signal when the target arrangement is exposed to the illumination source.

20. The target arrangement of claim 19 wherein the target arrangement has a center of symmetry and the at least two disambiguation features are such configured such that the disambiguation features are capable of being symmetrically rotated 180 degrees about axis of symmetry.

21. The target arrangement of claim 20 wherein,
the first set of periodic target cells of the target arrangement are arranged on the substrate in a two by two arrangement of four target cells; and
the second set of periodic target cells of the target arrangement are arranged on the substrate and positioned adjacent to the first set in another two by two arrangement of four target cells; and
the at least two disambiguation features are arranged so that,
a first disambiguation feature comprises a cross-shaped feature arranged between the four target cells of the first set of periodic features and constructed so that it resides in one of the top or bottom layers;
a second disambiguation feature comprises a cross-shaped feature arranged between the four target cells of the second set of periodic features and constructed so that it resides in same layer as the first disambiguation feature; and
a third disambiguation feature constructed so that it resides in the other of the top or bottom layers, and that includes an outer section that extends around four sides of the target arrangement encompassing the first and second disambiguation features and that includes an inner section that passes between the first and second sets of disambiguation features.

22. The target arrangement of claim 20 wherein each disambiguation feature has at least two perpendicular edges.

23. The target arrangement of claim 22 wherein each disambiguation feature is positioned in its entirety in a space between two adjacent target cells.

24. The target arrangement of claim 23 wherein each disambiguation feature is rectangular in shape.

25. The target arrangement of claim 12 wherein the targeting arrangement is further configured such that:
the plurality of periodic target cells include,
a first set of periodic target cells arranged so that the periodic features of the first and second layers of the first set of periodic target cells are oriented in a first configuration and arranged to enable the targeting arrangement to determine overlay error in a first direction;
a second set of periodic target cells arranged so that the periodic features of the first and second layers of the second set of periodic target cells are oriented in a second configuration that is perpendicular to the first configuration and arranged to enable the targeting arrangement to determine overlay error in a second direction that is perpendicular to the first direction; and
the disambiguation features arranged between the periodic target cells, the disambiguation features configured to resolve signal ambiguities caused by the generation of the overlay signal when the target arrangement is exposed to the illumination source.

26. The target arrangement of claim 25 wherein,
the first set of periodic target cells includes six target cells; and
the second set of periodic target cells includes six target cells.

27. The target arrangement of claim 25 wherein,
the first set of periodic target cells includes four target cells; and
the second set of periodic target cells includes four target cells.

28. A method for determining an overlay error between layers of a sample, the method comprising:
providing a substrate having a target arrangement formed thereon, the target arrangement comprising a plurality of target cells constructed such that each cell has a first and a second layer, where the plurality of target cells includes a set of coarse overlay bars configured such that the sides of the bars are exposed to allow each edge to be imaged and each of the first and second layer includes a set of periodic features configured such that the periodic features of the first layer have an offset relative to the periodic features of the second layer and also includes a plurality of symmetric coarse disambiguation features located within the targeting arrangement, the coarse disambiguation features being arranged so that they have a common center of symmetry with an associated group of target calls and configured such that the coarse disambiguation features are large enough to be optically imaged;
illuminating the target cells with the illumination source to generate overlay signals for each of the target cells;
obtaining a plurality of overlay signals, at least one such signal associated with each illuminated target cell;

processing the overlay signals associated with each illuminated target cell to obtain a plurality of ambiguous overlay measurements;

optically imaging the coarse disambiguation features to obtain a plurality of projection signals associated with the coarse disambiguation features;

processing the plurality of projection signals to obtain a plurality of coarse measurements of the center of symmetry for each of the coarse disambiguation features and each associated group of target cells;

using the coarse measurements of the center of symmetry to clarify the ambiguous overlay measurements; and processing the corrected overlay measurements to determine any overlay error between the first and second layers, using information obtained from the signal obtained for each of the target cells.

29. The method of claim 28, wherein the providing of the substrate having a target arrangement includes providing a target arrangement constructed such that the periodic features of the first layer have a different pitch than the periodic features of the second layer.

30. The method of claim 28, wherein, providing the targeting arrangement further includes providing a targeting arrangement having a first set of target cells having periodic features oriented in a first direction and a second set of target cells having periodic features oriented in a second direction and wherein the periodic features of both sets of target cells are configured so that said first and second layers each have a different pitch, wherein the relationship between the pitches is arranged to generate a periodic signal the target cells are exposed to an illumination source.

31. A target arrangement for determining overlay alignment on a substrate, the target arrangement comprising:
a substrate having at least two layers formed thereon, including a second layer formed above a first layer;
a target arrangement formed on the substrate and configured to include,
a plurality of spaced apart target cells configured to enable the generation of periodic overlay signals associated with the overlay of the first layer relative to the second layer, and
a plurality of optically resolvable disambiguation features arranged, at least in part, between the target cells of the target arrangement, where the plurality of optically resolvable disambiguation features includes a set of coarse overlay bars configured such that the sides of the bars are exposed to allow each edge to be imaged and the disambiguation features are configured to enable resolution of signal ambiguity in the periodic overlay signals, the plurality of target cells being surrounded by at Least one of the plurality of optically resolvable disambiguation features.

32. A target arrangement as in claim 31 wherein the a plurality of optically resolvable disambiguation features are configured to include,
a first disambiguation feature arranged between the target cells in one of the first and second layers, and
a second disambiguation feature arranged between the target cells in the other of the first and second layers.

33. A target arrangement as in claim 31 wherein the a plurality of optically resolvable disambiguation features are configured to include,
a first disambiguation feature arranged between the target cells in one of the first and second layers, and
a second disambiguation feature arranged around the target cells in the other of the first and second layers.

34. A target arrangement as in claim 31 wherein the target cells of the arrangement comprise four spaced apart target cells configured to enable overlay metrology measurements in two perpendicular axes,
wherein the first disambiguation feature has a cruciform shape arranged between the target cells; and
wherein the second disambiguation feature is arranged around the target cells and the first disambiguation feature.

35. A compact target arrangement for determining overlay alignment on a substrate, the target arrangement comprising:
a substrate having at least two layers formed thereon;
a target arrangement arranged to enable measurement of overlay alignment between said at least two layers, the target arrangement comprising,
a first set of optically resolvable target features arranged in a pattern that defines a space between said optically resolvable features, the first set of optically resolvable target features configured to enable coarse measurements of overlay between said at least two layers;
a second set of periodic high resolution target features arranged within the space defined by the first set of optically resolvable target features;
wherein said periodic high resolution target features are configured to enable generation of periodic overlay signals associated with the overlay alignment between said at least two layers and wherein the optically resolvable target features are configured to enable resolution of ambiguities in said periodic overlay signals to enable accurate measurement of overlay,
where the target arrangement includes a set of coarse overlay bars configured such that the sides of the bars are exposed to allow each edge to be imaged.

36. A compact target arrangement for determining overlay alignment on a substrate, the target comprising:
a substrate having at least two layers formed thereon;
a target arrangement, the target arrangement arranged to enable measurement of overlay alignment between said at least two layers, the target arrangement comprising,
a first set of optically resolvable target features, the first set of optically resolvable target features configured to enable coarse measurements of overlay between said at least two layers;
a second set of periodic high resolution target cells, the first set of optically resolvable target features and the second set of periodic high resolution target cells situated in close proximity to one another, such that a distance between the first set of optically resolvable target features and the second set of periodic high resolution target cells are smaller than a dimension of one of the second set of periodic high resolution target cells;
wherein said periodic high resolution target features are configured to enable generation of periodic overlay signals associated with the overlay alignment between said at least two layers and wherein the optically resolvable target features are configured to enable resolution of ambiguities in said periodic overlay signals to enable accurate measurement of overlay,
where the target arrangement includes a set of coarse overlay bars configured such that the sides of the bars are exposed to allow each edge to be imaged.

* * * * *